United States Patent [19]
Kondo

[11] Patent Number: 5,281,908
[45] Date of Patent: Jan. 25, 1994

[54] LOADING DEVICE ASSEMBLY

[75] Inventor: Toyoshi Kondo, Tokyo, Japan

[73] Assignee: Tatsumi Corporation, Tokyo, Japan

[21] Appl. No.: 849,331

[22] Filed: Mar. 10, 1992

[51] Int. Cl.⁵ .......................... G01R 31/34; G05F 1/12
[52] U.S. Cl. ............................ 324/158 MG; 323/297; 324/158 R
[58] Field of Search ................. 324/158 MG, 158 R; 338/56, 82; 323/296–298

[56] References Cited

U.S. PATENT DOCUMENTS 4,910,457  3/1990  Matsumoto ............... 324/158 R
5,107,209  4/1992  Kondo ...................... 324/158 R

*Primary Examiner*—Ernest F. Karlsen
*Attorney, Agent, or Firm*—Wenderoth, Lind & Ponack

[57] ABSTRACT

A transportable loading device assembly includes a low-voltage small-capacity variable loading device having a load change-over element which enables the load to be applied to be incrementally variable, a transformer connected to the variable loading device, and a power input terminal provided for the variable loading device or transformer. The assembly further includes a plurality of a high-voltage small-capacity fixed loading devices having respective power input terminals and connected in parallel with the variable loading device, and fans located adjacent to and associated with the variable loading device and the fixed loading devices. The power generator can be tested by controlling the load applied thereon by controlling the load change-over element and controlling the inputs applied to the variable loading device and a plurality of the fixed loading devices.

1 Claim, 4 Drawing Sheets

LOADING DEVICE ASSEMBLY

BACKGROUND OF THE INVENTION

1. Field of the Invention

The present invention relates to power supply testing equipment for non-utility power generators, etc. set up in high-rise buildings or other facilities in order to cope with emergency situation such as power breakdown, thereby determining whether or not they are in good condition. In particular, this invention is concerned with a loading device assembly for so-called dry type testing equipment in which a plurality of resistors each formed of a metal member are used for testing purposes without recourse to resistance water.

2. Prior Art

Referring now to FIG. 4, there is shown a typical power supply testing system used for non-utility power generators. As illustrated, a rectangular tank 71, through which a current passes, is charged with resistance water 72 of about 20° C. While three pairs of vertically movable electrode plates 73 and 73 extending in three directions are immersed in the water 72, power is supplied from a non-utility power generator (not shown) between the electrode plates 73 and 73 for the time required to test and confirm its performance such as its power generating capability or its serviceability.

Referring to the typical testing procedure of this type of testing equipment, there is constantly a current of about 642.6 A, when power is supplied from a non-utility power generator working at an output of 1000 KVA, a power factor of 0.8 and a voltage of 415 volts between the electrode plates 73 and 73 in the tank 71.

This power generator is determined to have given power generating capability and serviceability, if there is no fault in its performance when power supply is continued for, e.g., 3 hours.

However, the resistance water 72 in the tank 71 increases in temperature due to the power supply and reaches as high as about 80° C. when it overflows a drainage port 75, as illustrated.

To what degree currents are passed between the electrode plates 73 and 73 through the resistance water 72 is determined largely by the temperature rise or fall of the resistance water 72 and the degree of contamination of the resistance water 72. This in turn leads to a variation in the preset testing conditions, say, an output of 1000 KVA, a power factor of 0.8, a voltage of 415 V and a current of 642.6 A, under which the non-utility power generator works to supply power between the electrode plates 73 and 73 in the tank 71, thus resulting in a current exceeding 642.6 A flowing through the tank 71.

For that reason, there is often an overload on the generator and the associated engine.

Thus, the conventional testing equipment is designed to keep a current passing through it from exceeding a preset value of 642.6 A. For instance, this is achieved by moving the electrode plates 73 vertically to regulate the current-passing areas thereof in the resistance water 72 or supply an additional amount of fresh, low-temperature resistance water 72 through a water supply port 74, thereby limiting the temperature rise of the resistance water 72 in the tank 71.

However, the above conventional testing equipment is of size so large that it is very inconvenient to carry to where the power generator testing is needed and much time and labor are needed until it is set up.

No precise control of the electrode plates 73 is achieved as well, because much difficulty is involved in their vertical movement.

Another grave problem with this equipment is that it needs a continuous supply of fresh resistance water 72, which must immediately be discarded. Not only is the use of such a large quantity of water economically unfavorable, but the resistance water 72, once used, must be inconveniently discharged as well, thus creating environmental problems.

In order to provide a solution to the above problems, we have already come up with a small, economical and safe testing system which can test a non-utility power generator regardless of where it is set up, prevent an unusual current increase during testing by simple operation and make good use of resistance water, as set forth in JP-A-62-204866, JP-A-1-202554, JP-A-2-82183, JP-A-2-89754, JP-A-2-249798, JP-A-2-86755, JP-A-3-76270 and JP-A-3-100180.

As illustrated schematically in FIG. 3, this testing system is built of a tank 81 charged therein with a resistance liquid 86, a plurality of electrodes 82, each being fixed at one end on the upper portion of the tank 81, extending downwardly through the tank 81 and immersed in the resistance liquid 86 for receiving power from the non-utility power generator to be tested, a plurality of movable insulators 83, each being disposed in the tank 81 for making the quantity of a current through the electrode 82 variable, and a fan for feeding air forcedly onto the surface of a radiator 84 which serves to cool the resistance liquid 86 in the tank 81 (and onto which water is jetted from a spray pipe).

This testing system enables load tests for non-utility power generators, etc. to be done with a simplified structure and with no need of using large amounts of water.

Dissatisfied with this testing system, we have embarked on developing visionary testing equipment which can dispense with resistance water entirely, and so have now accomplished this invention.

In some cases, non-utility power generators must be set up in intermountain remote districts—that are depopulated areas, where much difficulty is encountered in providing sufficiently large amounts of water.

In some cases, they must be tested even in snowy districts having a large snowfall, where considerable difficulty is again encountered in supplying a large quantity of water.

In particular, much difficulty is involved in making a dry type testing equipment for testing high-voltage large-capacity generators of the order of 6.6 KV in voltage and 2000 KW in capacity. This is not only because loading devices—serving as resistance elements—made up of a metal member are inevitably of large size and cost much, but also because it is difficult to provide a fine-adjusting mechanism for setting the load.

In the present disclosure, the "low-voltage type" and "high-voltage type" refer to generators of about 500 V or less and about 1000 V or more, respectively, and the small-capacitor type" and "large-capacity type" refer to generators of about 500 KW or less and about 800 KW or more, respectively.

A major object of this invention is to eliminate the above problems associated with conventional testing facilities by providing a loading device assembly which can be used in the absence of water, is inexpensive to assemble and allows simple and accurate testing of a high-voltage large-capacity power generator.

SUMMARY OF THE INVENTION

According to this invention, the above object of this invention is achieved by a loading device assembly which, as illustrated in FIG. 1, includes:

a low-voltage small-capacity type of variable loading device (12) having a load change-over element (10) which enables the load to be applied to be incrementally variable, a transformer (14) connected to the variable loading device (12), a power input terminal (15) provided for the variable loading device (12) or the transformer (14), a plurality of a high-voltage small-capacity type of fixed loading devices (16-1, 16-2, 16-3, ..., 16-n) having the respective power input terminals (17-1, 17-2, 17-3, ..., 17-n) and connected in parallel with the variable loading device (12), and fans (18-1, 18-2, 18-3, ..., 18-n) located adjacent to and associated with the variable loading device (12) and the fixed loading devices (16-1, 16-2, 16-3, ..., 16-n), whereby said power generator can be tested as to whether it is in good condition by controlling the load applied thereon by said load change-over element (10) and controlling the inputs given to the variable loading device (12) and a plurality of the fixed loading devices (16-1, 16-2, 16-3, ..., 16-n).

According to this invention, the load test of a high-voltage large-capacity type of power generator in particular can be conducted without the need of using resistance water by operating selectively the transformer, the small-capacity type of variable loading device connected to the transformer and designed to regulate a load value incrementally and a plurality of the high-voltage small-capacity type of fixed loading devices.

BRIEF DESCRIPTION OF THE DRAWINGS

One embodiment of the loading device assembly according to this invention will now be explained specifically but not exclusively with reference to the accompanying drawings, in which.

PREFERRED EMBODIMENT OF THE INVENTION

Figure 1:
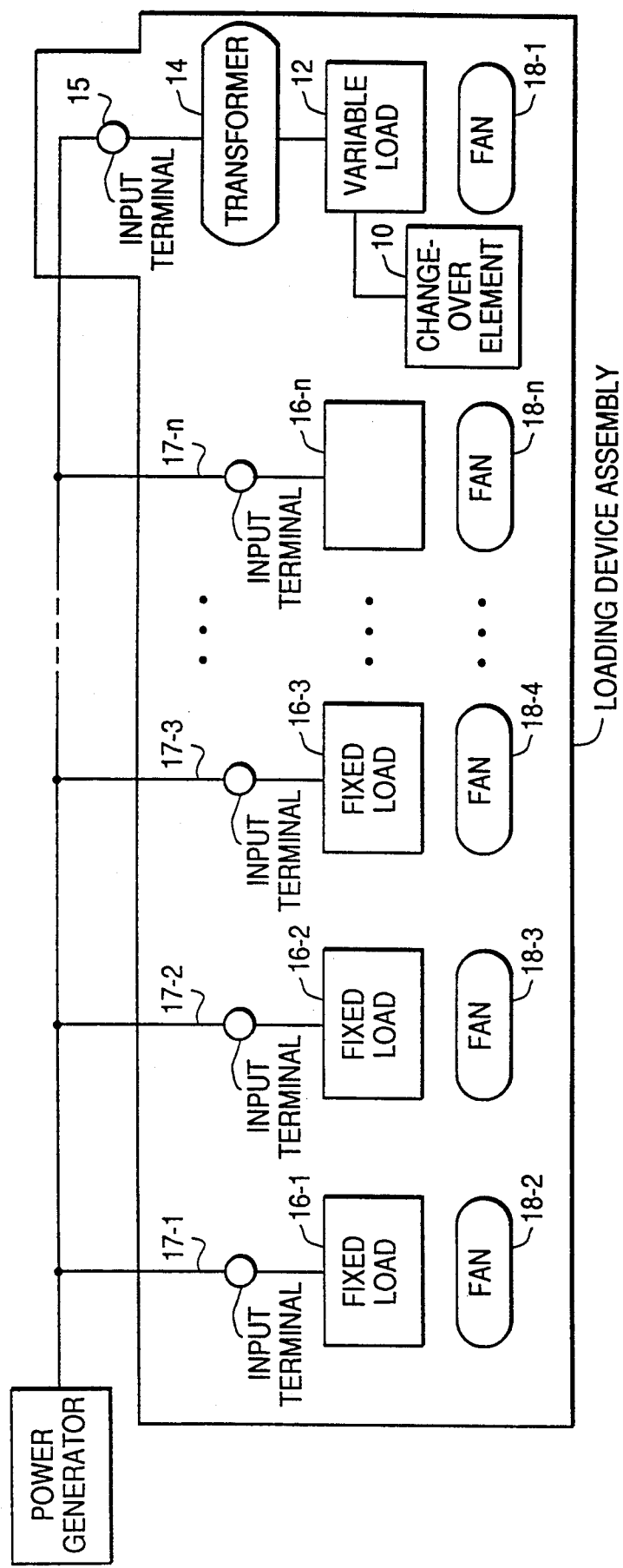
FIG. 1 represents the principles of this invention.
Figure 2:
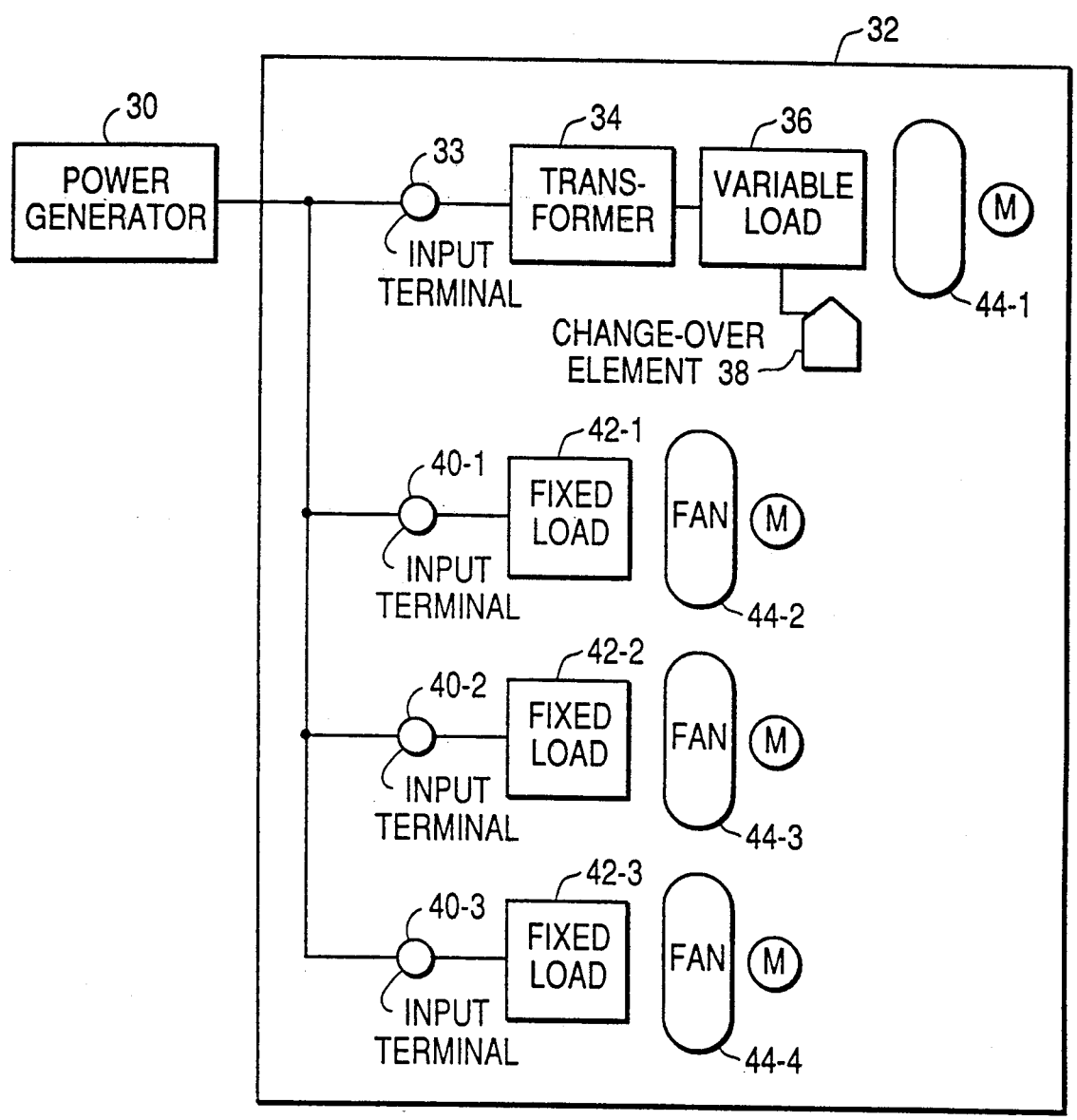
FIG. 2 illustrates one embodiment of this invention.
Figure 3:
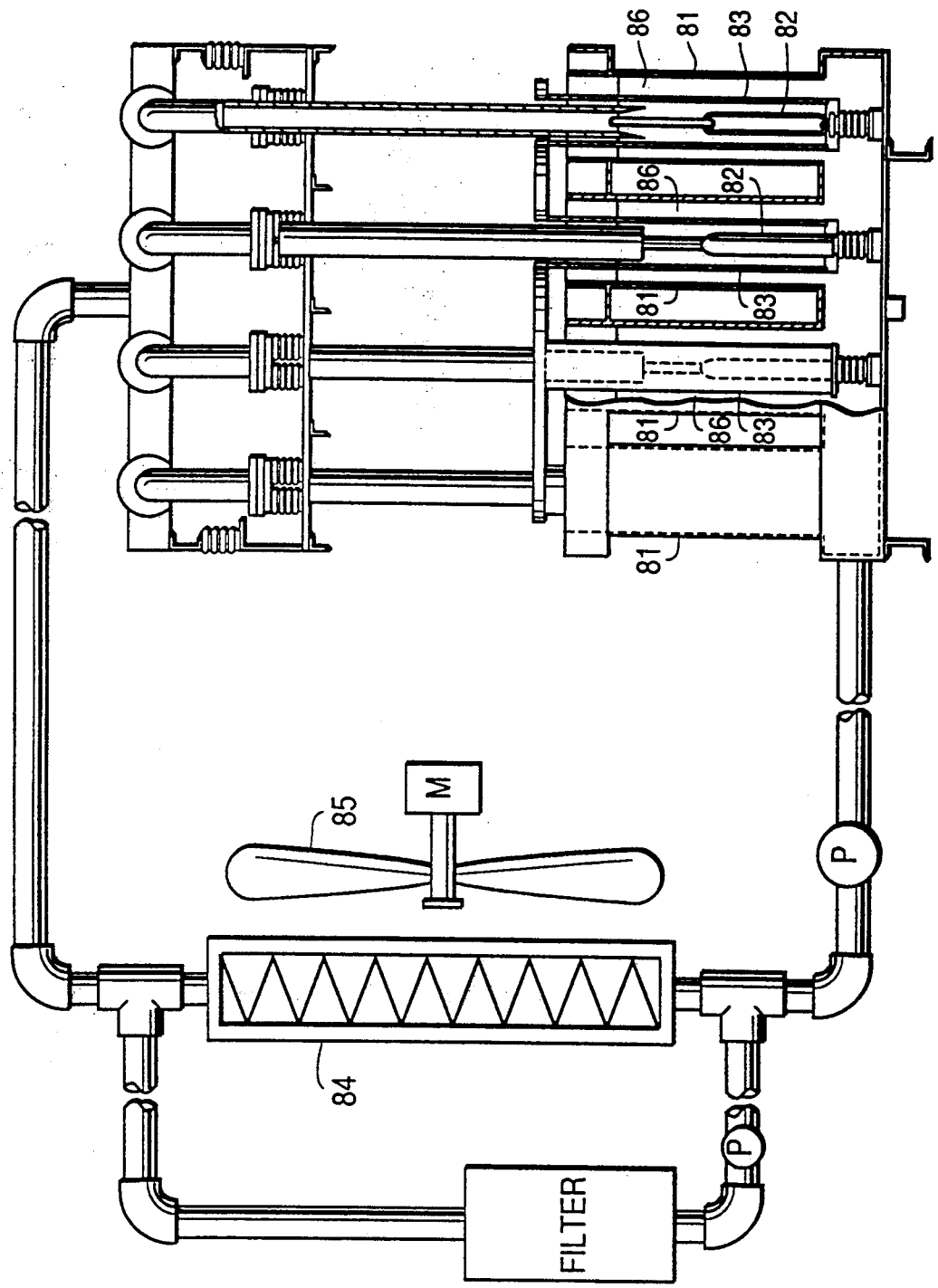
FIG. 3 illustrates one typical example of the prior art testing equipment.
Figure 4:
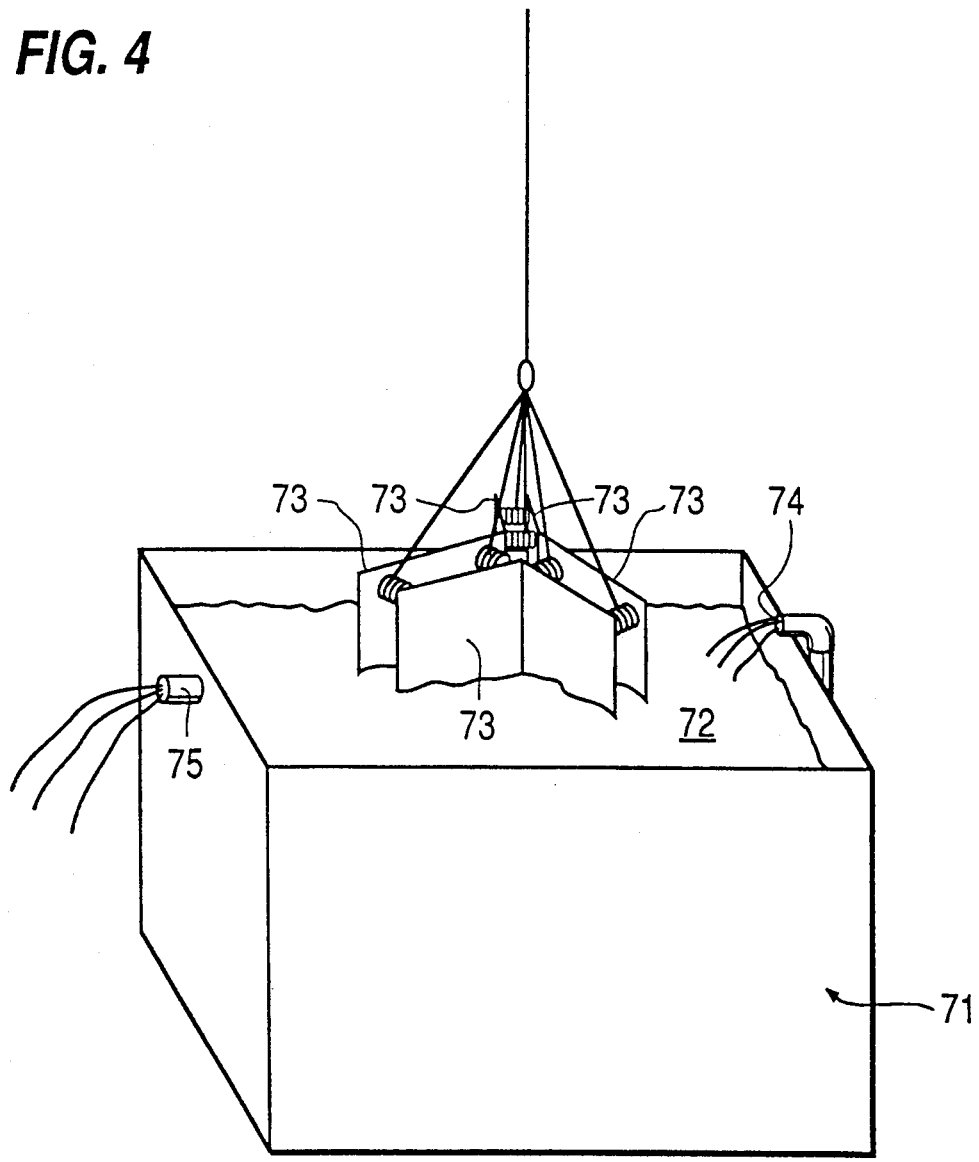
FIG. 4 illustrates another example of the prior art testing equipment.

Referring to FIG. 2, there is shown one preferred embodiment of the loading device assembly according to this invention, in which reference numeral 30 stands for the non-utility power generator to be tested.

Connected with the power generator 30 is an loading device assembly 32.

As illustrated, the loading device assembly 32 is made up of a transformer 34 connected to the power generator 30 through a power input terminal 33, a low-voltage small-capacity type (e.g., 415 V and 500 KW) of variable loading device 38, a load change-over element 36 provided on the device 36, a plurality of high-voltage small capacity type of fixed loading elements 42-1, 42-2 and 42-3 connected to the power generator 30 through power input terminals 40-1, 4-2 and 40-3 and fan elements 44-1, 44-2, 44-3 and 44-4 located adjacent to the loading devices 36, 42-1, 42-2 and 42-3.

As mentioned above, the variable loading device 35 connected with the transformer 34 and the three fixed loading devices 42-1, 42-2 and 42-3 are connected in parallel with the power generator 30 through the respective power input terminals 33, 40-1, 40-2 and 40-3.

The variable loading device 36 is designed to receive incremental loads of, for instance, 125 KW, 250 KW, 375 KW and 500 KW through the load change-over element 38.

For instance, a high-voltage (6.6 KV) large-capacity (2000 KW) type of power generator is tested with the loading device assembly 32 which is made up of, e.g., one transformer 34, one low-voltage small-capacity type of variable loading device 36 (with a capacity of 500 KW and a voltage of 415 V) connected to the transformer 34 and three fixed loading devices 42, 42 and 42 (each with a capacity of 500 KW and a voltage of 6.6 KV), all connected in parallel with each other.

The generator testing is done by a so-called load test and a so-called governer test. For the load test, a load of 500 KW is first applied to the power generator for 10 minutes. Next is applied a further 500 KW or a total load of 1000 KW for about 10 minutes. Next is applied a further 500 KW or a total load of 1500 KW for about 10 minutes. Finally applied is a further 500 KW or a total load of 2000 KW for about 3-4 hours.

As can be understood from FIG. 2, the initial 500 KW load test is carried out by connecting the power input terminal 40-1 for the fixed loading device 42-1 placed at the second stage to the power generator 30, and the next 1000 KW load test is done by connecting the power input terminals 40-1 and 40-2 for the second and third fixed loading devices 42-1 and 42-2 to the generator 30.

The next 1500 KW load test is carried out by connecting the input terminal 40-3 for the fixed loading device 42-3 located at the fourth stage to the generator 30.

Especially when the generator 30 is operated by a diesel engine, however, it is impossible to apply a 500 KW load to the generator 30 at one time for the final 2000 KW load test in consideration of protecting the diesel engine; that is, that load must be incrementally applied to the generator 30.

For this reason, the transformer 34 and the low-voltage small-capacity type of variable loading device 36, both located at the first stage, is connected to the generator 30 through the power input terminal 33 to increase the load thereon incrementally by operating the load change-over element 38 provided on the variable loading device 36, whereby the final load of 2000 KW is applied on the generator 30 over a period of 3-4 hours.

When testing the generator 30 which is of a high-voltage large-capacity type, it is thus always required to control the load to be applied thereon. With cost and production technique problems in mind, however, load control is now achievable only by relying on low-voltage loading devices.

According to this invention, however, such load control is well achievable by decreasing the voltage from 6.6 KV to 415 V through the transformer 34.

How to carry out the governor test will now be explained.

The goal of this test is to determine whether there is a fault in a prime mover or power generator by loading and unloading.

For instance, a high-voltage (6.6 KV) large-capacity (1000 KW) type of power generator 30 is tested with test equipment that is a loading device assembly 32 made up of one transformer 34, one low-voltage (415 V) small-capacity (500 KW) type of variable loading device 36 connected to the transformer 34 and one fixed loading device 41 (with a capacity of 500 KW and a voltage of 6.6 KV), all connected in parallel with each other.

In this case, the governor test is carried out by loading and unloading 250 KW, then 500 KW, then 750 KW and finally 1000 KW.

The first 250 KW loading and unloading are carried out while the transformer 34 and variable loading device 36 located at the first stage are connected to the generator 30 through the associated power input terminal 33 and the load is set at 250 KW by operating the load change-over element 38 provided on the variable loading device 36.

Likewise, the second 500 KW loading and unloading are done while the load of 500 KW is applied on the variable loading device 36 by operating the load change-over element 38 provided thereon.

Then, the 750 KW loading and unloading are done by the fixed loading device 42 (with a capacity of 500 KW and a voltage of 6.6 KV) and the variable loading device 36 whose load is regulated to 250 KW by the load change-over element 38.

Finally, the 1000 KW loading and unloading are carried out by the fixed loading device 42-1 (with a capacity of 500 KW and a voltage of 6.6 KV) and the variable loading device 36 regulated to a maximum load of 500 KW by the load change-over element 38.

As mentioned above, load control is also needed for the governor test, and so the variable loading device 36 connected to the generator 30 through the transformer 34 is vitally important.

Note that of importance during testing is to cool the loading devices 36, 42-1, 42-2 and 42-3 by the respective fans 41-1, 41-2, 41-3 and 41-4 located adjacent to them, because of their temperature increase.

Also note that the loading device assembly is premounted on the bed of a vehicle because it is often carried to where the power generator testing is needed.

Thus, the testing of a high-voltage (e.g., 6.6 KV) large-capacity (e.g., 1000 KW or 2000 KW) type of power generator can be conducted safely and precisely without the need of using water by placing the loading devices of the assembly under load control and selecting properly which devices are to be used.

What is claimed is:

1. An apparatus for use in the testing of a high-voltage large-capacity power generator without the deployment of a water resistance load, said apparatus comprising:

a transportable variable load assembly which is operatively connectable to the high-voltage large-capacity power generator and which is devoid of a water resistance load, said transportable variable load assembly including
 (a) a transformer,
 (b) a low-voltage small-capacity variable loading device connected to an output of said transformer,
 (c) a load change-over element connected to said variable loading device for incrementally varying a load of said variable loading device,
 (d) a first power input terminal for selectively connecting the high-voltage large-capacity power generator to one of said transformer and said low-voltage small-capacity variable loading device,
 (e) a plurality of high-voltage small-capacity fixed loading devices,
 (f) a plurality of second power input terminals, connected in parallel to each other and in parallel to said first power input terminal, for respectively connecting the plurality of high-voltage small-capacity fixed loading devices to the high-voltage large-capacity power generator, and
 (g) a plurality of cooling fans respectively located adjacent to and associated with said low-voltage small-voltage variable loading device and said plurality of high-voltage small-capacity fixed loading devices, wherein a test load of the high-voltage large-capacity power generator is selectively variable by controlling said first and second power input terminals and said load change-over element of said transportable variable load assembly.

* * * * *